United States Patent [19]

Moraw et al.

[11] 4,269,932
[45] May 26, 1981

[54] PROCESS FOR PREPARING AN ORIGINAL INFORMATION CARRIER FOR ZERO-ORDER DIFFRACTION

[75] Inventors: Roland Moraw; Renate Schädlich, both of Naurod, Fed. Rep. of Germany

[73] Assignee: Hoechst Aktiengesellschaft, Frankfurt am Main, Fed. Rep. of Germany

[21] Appl. No.: 928,701

[22] Filed: Jul. 27, 1978

[30] Foreign Application Priority Data

Aug. 1, 1977 [DE] Fed. Rep. of Germany ....... 2734580

[51] Int. Cl.³ .............................................. G03C 5/00
[52] U.S. Cl. ............................... 430/290; 350/162 R; 350/162 SF; 353/31; 430/321; 430/325; 430/326; 430/394; 430/396; 430/494
[58] Field of Search ................... 96/17, 27 R, 35, 35.1, 96/38.3, 79, 80; 427/162, 164; 40/361; 353/31, 120, 121; 350/162 SF, 3.5, 162 R; 430/290, 321, 325, 326, 394, 396, 494

[56] References Cited

U.S. PATENT DOCUMENTS

| 3,097,096 | 7/1963 | Oster | 96/30 |
|---|---|---|---|
| 3,672,894 | 6/1972 | Glenn | 96/38.3 |
| 3,732,363 | 5/1973 | Glenn | 346/766 X |
| 3,743,507 | 7/1973 | Sen Ih et al. | 96/38.3 X |
| 3,763,296 | 10/1973 | Burrows | 96/30 X |
| 3,834,801 | 9/1974 | Schreckendgust | 353/20 |
| 3,947,105 | 3/1976 | Smith | 350/162 SF X |
| 3,957,354 | 5/1976 | Knop | 350/162 SF |
| 3,993,489 | 11/1976 | Heimsch et al. | 96/80 X |
| 4,006,018 | 2/1977 | Wiese | 96/30 X |
| 4,017,158 | 4/1977 | Booth | 350/162 SF |

*Primary Examiner*—Edward C. Kimlin
*Attorney, Agent, or Firm*—Schwartz, Jeffery, Schwaab, Mack, Blumenthal & Koch

[57] ABSTRACT

A process for producing a relief original information carrier is disclosed comprising the steps of exposing a recording layer mounted on a carrier to a grating pattern, image-wise exposing the recording layer through at least one of individual color separation originals to form relief part-images and developing the exposed recording layer. The grating pattern exposure is made for a time sufficient to provide, upon subsequent development, a uniform relief depth corresponding to a certain predetermined color. The subsequent image-wise exposure is made utilizing individual color separation originals which are transparent in the areas of the particular projection colors of the individual color separation originals and which form relief part-images of the projection color which adjoin one another without overlap.

6 Claims, 1 Drawing Figure

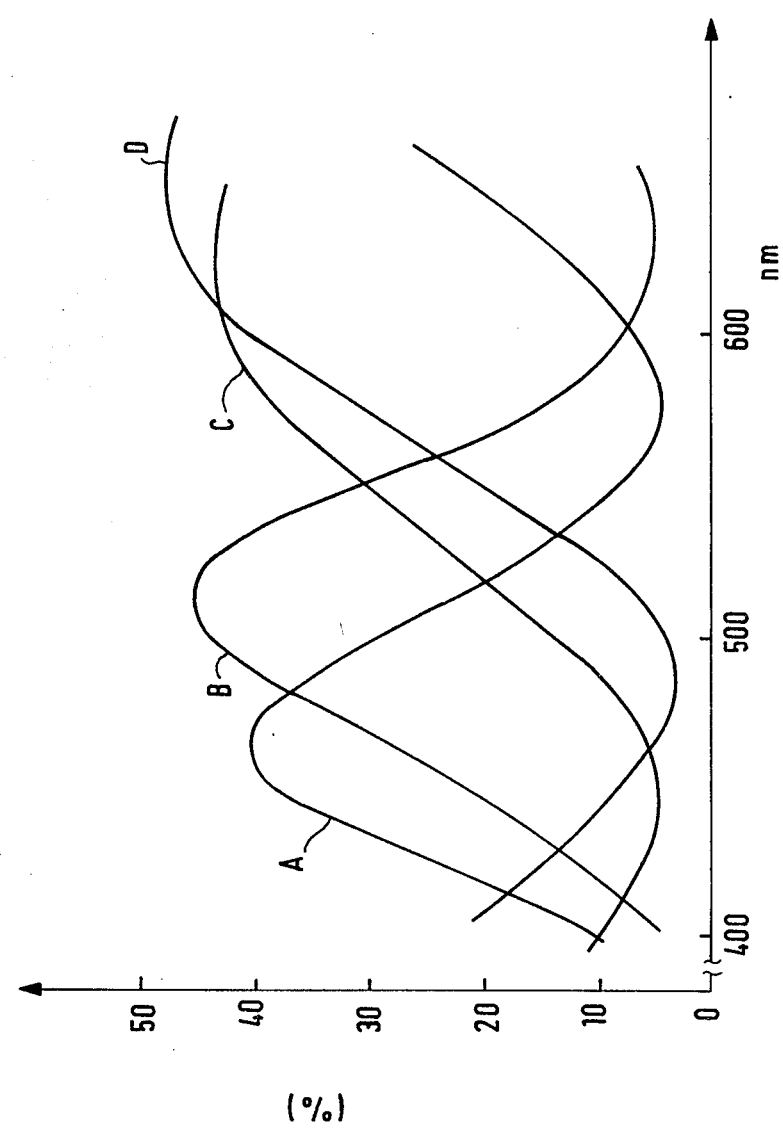

PROCESS FOR PREPARING AN ORIGINAL INFORMATION CARRIER FOR ZERO-ORDER DIFFRACTION

BACKGROUND OF THE INVENTION

The present invention relates to a method for the preparation of an original, wherein the recording layer is information-wise and grid-wise exposed and developed to give a relief image. The recording layer is exposed information-wise through individual color separation originals which are transparent in the areas of the appropriate projection color in the particular color separation original and of which the part-image areas of the projection colors adjoin one another without overlap. In addition, an exposure, with grid patterns, separated in time from the part-image exposure, and an aqueous-alkaline development are performed.

Images which are grid-wise screened are produced by ZOD (Zero-Order-Diffraction) technique which is known from the journal, *Laser u. Opto-Elektronik*, No. 3/1976, pages 16/17. Three nickel matrices are produced from the relief images which, for example, correspond to three primary color grid patterns in yellow, magenta and cyan in a photo-lacquer, and these matrices are used to emboss colorless thermoplastic films of, for example, polyvinyl chloride. These films are mechanically superposed and; upon projection using conventional projectors, colored projection images are obtained from the colorless relief images. The grid-like screening is effected with relief grids of rectangular cross-section, the grid period being about 1.5 $\mu$m. One nickel matrix of different relief depth is made for each color separation in magenta, yellow and cyan, and the separate embossed images are generated using these matrices. The relief depths differ, the relief depth of the cyan separation being the greatest and that of the yellow separation being the smallest. These color separation images are screened. The embossed images are superposed to give a three-layer relief image, from which colored images can be projected. The technique described gives very bright color images of high resolution. The relief images can be duplicated relatively cheaply and rapidly by embossing.

A disadvantage which makes the acceptance of this technique more difficult is the expensive preparation process with three completely separate working steps for making the individual embossed relief images corresponding to the color separations. A further disadvantage is the composing of the three separate relief images in a true fit to give the composite image required for the colored projection.

A solution which overcomes these disadvantages has already been suggested in co-pending patent application, Ser. No. 861,491, filed Dec. 16, 1977 by Roland Moraw et al and entitled "Information Carriers, Method of Forming and Copying Said Carriers". According to this teaching, the relief image is composed from the relief part-images corresponding to the individual color separations in such a way that areas of different color, which can also be screen dots in the case of screened images, are located in one plane, with these areas of different color not intersecting but at most touching one another. Relief images of this type are very suitable for depicting two-dimensional multi-colored originals, such as graphical illustrations, in the form of relief grid structures in one plane.

In the process disclosed in the aforementioned application, Ser. No. 861,491, the disclosure of which is incorporated by reference herein, the grid-wise exposure and the image-wise color separation exposures are carried out separated in time, the grid-wise exposure taking place right through the photo-lacquer or photoresist layer down to the carrier material. This process utilizes three main colors.

A further development of the recording of the grid image uses four main colors, for which corresponding color separation originals are employed for the color separation exposures by simply contact exposure. This teaching is disclosed in Application Ser. No. 928,700, filed July 27, 1978 whose disclosure is hereby incorporated by reference herein.

SUMMARY OF THE INVENTION

It is an object of the present invention to improve the process described initially in such a way that a saving of time is accomplished in manufacturing such images, the quality of the projected images remaining equivalent or at least nearly equivalent to the colored original image.

This object is accomplished utilizing a method for preparing a relief original information carrier comprising the steps of exposing a recording layer mounted on a carrier to a grating pattern for a time sufficient to provide, upon subsequent development, a uniform relief depth corresponding to a certain projection color; subsequent to said grating pattern exposure, image-wise exposing said recording layer through at least one of individual color separation originals to form relief part-images, each of the color separation originals being transparent in the areas of the particular projection colors of the individual color separation originals and each of the relief part-images of the projection color adjoining one another without overlap; and developing the exposed recording layer.

DETAILED DESCRIPTION OF THE PREFERRED EMBODIMENT

According to the invention, the achievement of the above object comprises first, the grid-wise exposure of the recording material over the entire image area up to a uniform relief depth, and then the part-image exposure without grid structure being carried out, using graded light energies which are lower than the light energies for the grid image exposure.

In the adopted procedure, the grid-wise exposure is taken to a uniform relief depth which corresponds to a certain projection color. The adaption of the grid depth to the particular color separation image then takes place during the image-wise (non-grid) exposure. This occurs because the relief depth first increases in a grid formation phase, since the parts of the layer, which have already had some exposure, are fully exposed more quickly than the parts of the layer which until then were covered by ridges of the structured grid. This is then followed by a grid degradation phase in which the relief depth decreases again, in particular on approach to the carrier in the end phase of the exposure. With the exception of the end phase, the grid formation and grid degradation are largely independent of the layer thickness of the recording material, for example a photo-lacquer. In any case, the reproducibility and the luminance of the projection colors are the same or even better than in an immediate grid-wise exposure of the recording material until the carrier is reached.

In an embodiment of the invention, the grid-wise exposure is taken to a uniform relief depth which corresponds to the projection color green or red. The number of image-wise color separation exposures can thus be reduced by one, which results in the saving of time.

It is evident that, for the reproducible generation of predetermined relief depths and hence of defined projection colors, all the recording parameters must be kept constant with a high accuracy. In order to take into account fluctuations in the projection colors as a result of influences which are difficult to control, a calibration curve is plotted, and the effective exposure times of the recording material can for some time be taken from this calibration curve.

Layers of a photo-lacquer which are about 2.5 μm thick are exposed on a carrier in an grid-wise and image-wise fashion for the preparation of an original. The image-wise exposure is preferably effected in contact with the particular color separation original or a black separation original, and the grid-wise exposure is preferably effected in contact with a grid original, for example a glass plate having areas which are transparent to light and areas which are covered by metal ridges in order to be made opaque. In the case of the preferred positive photo-lacquers which contain o-quinone diazides and in which the exposed parts of the layer are dissolved away on development, actinic light is radiated for example, in the form of parallel light from a 200 watt mercury high-pressure lamp through a quartz lens having a focal length of f = 15 cm and through a blue glass filter having a maximum transmission of 75% of the light intensity at the wavelength of 400 nm. To prepare a metal matrix utilized as a master for embossing the information carrier, the exposed and developed photo-lacquer original is coated with a thin electrically conductive layer on which a metal coating is deposited by electroplating. Subsequently, the original and the metal coating are separated from one another thus forming the metal matrix. The surface of the metal coating which makes contact with the original represents the negative relief image of the original. A deformable material, from which the information carrier is produced, for example polyvinyl chloride, is then embossed with the metal matrix in a manner which is known in the art, typically under pressure and with a lowering of the viscosity, which in most cases depends on the temperature.

The projection colors which appear at certain light energies radiated in can be seen from the examples which follow.

EXAMPLE 1

First, a calibration curve is plotted for an approximately 2.5 μm thick layer of a photo-lacquer which produces a positive, such as is manufactured, for example, by the Shipley Comp. Inc., Newton, Mass., USA. For this purpose, the photo-lacquer is applied by whirling and drying to a smooth transparent polyester film. Subsequently, this layer is irradiated with actinic light in a contact arrangement with a grid of 600 lines/mm, consisting of metal ridges on a glass plate, and developed in an aqueous-alkaline medium, and white light is radiated through. The projection colors of the calibration curve, which are compiled in column 2 of Table 1, thus appear as a function of the light energy supplied.

TABLE 1

| Grid Exposure | | Homogeneous After-Exposure | |
|---|---|---|---|
| Light Energy (mJ/cm$^2$) | Projection Colors | Light Energy (mJ/cm$^2$) | Projection Colors |
| 75 | yellow-brown | 0 | green (very bright) |
| 85 | red-brown | 15 | yellow-green (very bright) |
| 95 | blue-violet (very bright) | 45 | blue-green (bright) |
| 135 | yellow (very bright) | 70 | magenta-red (very bright) |
| 155 | magenta-red (very bright) | 90 | yellow (very bright) |
| 185 | blue-green (very bright) | 120 | blue-violet (bright) |
| 240 | green (very bright) | | |
| 360 | magenta | | |

It is pointed out that the values of the light energies radiated in during the grid exposure and the light energies of the homogeneous after-exposure in the same row of table 1 are not correlated to each other, and that the values in columns 3 and 4 are only related to the light energy 240 mJ/cm$^2$ of the grid exposure.

If, for example, the projection color green is desired to be obtained in the final recording material it is not necessary, for this purpose, to carry out an image-wise exposure by means of a color separation original for green. Instead, a new recording layer of the same type is grid-wise exposed with 240 mJ/cm$^2$ and is subsequently image-wise exposed without a grid original. Experimentally, a homogeneous exposure was made after the initial grid exposure to determine color characterics which would occur for subsequent image-wise exposures. The resulting projection colors are indicated in Table 1 in column 4 and are given as a function of the homogeneously supplied light energy in column 3 for the subsequent (after) exposure, e.g., subsequent to the grid exposure with 240 mJ/cm$^2$ in Table 1. As a comparison shows, the projection color magenta, that is to say a red with a blue tinge, which corresponds to a light energy of 360 mJ/cm$^2$ radiated in during the grid exposure, differs from the projection color blue-violet which corresponds to a light energy of 120 mJ/cm$^2$ radiated in during the homogeneous after-exposure, although a total light energy of 240 mJ/cm$^2$ + 120 mJ/cm$^2$ = 360 mJ/cm$^2$ was applied to the recording layer by the after-exposure, that is to say the same quantity as in the grid exposure alone. The reason for this color difference is that, during the grid illumination, the parts of the layer of the photo-lacquer, which lie below the grid ridges, are not directly exposed fully, but are only slightly degraded by scattered light, whilst the grid has been removed for the homogeneous after-exposure and the parts of the layer, which are no longer covered, are degraded by exposure.

The desired image is produced in such a manner that a new layer of photo-lacquer is grid-wise exposed with 240 mJ/cm$^2$. Subsequently, an exposure is carried out under color separation originals which are placed in a true fit and which are transparent only in the image areas of the particular color separation color and in the white image areas, and in particular, to obtain the projection colors red/yellow/blue, light energies of 70/90/120 mJ/cm$^2$ are radiated through the color separation originals. For black, after the grid-wise exposure with a grating of 600 lines/mm there is placed in crossed position a grating of 138 lines/mm onto a separation original for the color black and a light energy of 140 mJ/cm² is radiated in.

After the aqueous-alkaline development, white light is radiated through the original obtained and a multicolored image corresponding to the original is projected by means of a lens of aperture 1:2.8. The black image areas should be characterized as dark-brown rather than black. In the colored image areas, the spectral transmissions which are shown in the figure were measured. Above an amount of about 3% of scattered light, transmissions having maximum values of about 50% are building up, curve A for blue-violet having a maximum at about 460 nm, curve B for green having a maximum at about 510 nm, curve C for yellow having a maximum at about 620 nm and curve D for red, with a shading towards magenta, having a maximum at approximately 650 nm. When the original is processed further by producing a metal embossing matrix or mold by means of which PVC films can be embossed, the exposure times must be multiplied by a factor of 1.06 for a corresponding color reproduction from the embossed PVC films. The added exposure is necessary in order to take into account the differing refractive indices between the PVC film and the photo-lacquer layer.

EXAMPLE 2

An approximately 3.5 μm thick layer of the same photo-lacquer as in Example 1 is irradiated with actinic light in a contact arrangement with a grid of 138 lines/mm, consisting of metal ridges on a glass plate, and developed in an aqueous-alkaline medium, and white light is radiated through. The projection light is passed through a stopped-down lens of long focal length. The projection colors compiled in Table 2, column 2, thus appear as a function of the magnitude of the light energies supplied.

TABLE 2

| Grid Exposure | | Homogeneous After-Exposure | |
|---|---|---|---|
| Light Energy (mJ/cm²) | Projection Colors | Light Energy (mJ/cm²) | Projection Colors |
| 70 | yellow-brown | 0 | yellow |
| 80 | red-brown | 30 | magenta-red |
| 90 | blue-violet | 50 | blue |
| 120 | yellow | 80 | green |
| 140 | magenta-red | — | — |
| 165 | blue-green | — | — |
| 195 | green | — | — |
| 260 | magenta | — | — |

If the projection color yellow is to be obtained immediately, a recording layer of the same type is grid-wise exposed with light energy of 120 mJ/cm². For obtaining other colors too, a homogeneous after-exposure is necessary. The projection colors indicated in Table 2 thus appear as a function of the homogeneously supplied light energies.

The image-wise exposure is carried out analogously to the process described by reference to Example 1.

EXAMPLE 3

An approximately 2.5 μm thick layer of a photo-lacquer, which is sensitometrically harder than that in Examples 1 and 2, is irradiated with actinic light in a contact arrangement with a grid of 600 lines/mm, consisting of metal ridges on a glass plate, and developed in an aqueous-alkaline medium, and white light is radiated through. The projection light is focused by a lens of aperture 1:2.8. The projection colors, which follow in Table 3, column 2, thus appear as a function of the light energies supplied.

TABLE 3

| Grid Exposure | | Homogeneous After-Exposure | |
|---|---|---|---|
| Light Energy (mJ/cm²) | Projection Colors | Light Energy (mJ/cm²) | Projection Colors |
| 90 | brown | 25 | green-blue |
| 90 | blue-violet | 45 | magenta-red |
| 95 | yellow | 55 | yellow |
| 105 | magenta-red | 85 | blue-violet |
| 120 | blue | — | — |
| 160 | magenta-red | — | — |
| 180 | yellow | — | — |
| 225 | blue-violet | — | — |

It can be seen from the mutual gradation of the exposure energies, which is small compared with the photo-lacquer used in Example 1, that the photo-lacquer employed has sensitometrically hard characteristics. For grading the colors by homogeneous after-exposure, irradiation first takes place with 90 mJ/cm² through a grid of 600 lines/mm, in order to obtain the projection color blue-violet. Subsequently, a homogeneous after-exposure is carried out. The projection colors compiled in Table 3, column 4, thus appear as a function of the light energies supplied.

What is claimed is:

1. A process for producing a relief original information carrier for use in zero order diffraction color projection which comprises the steps of:
    (a) exposing an entire recording layer containing a photoresist layer applied on a carrier to a grating pattern for a time sufficient to provide, upon subsequent development, a uniform relief path corresponding to a certain projection color, and being smaller than the thickness of the recording layer,
    (b) subsequent to said grating pattern exposure, image-wise exposing said recording layer through at least one of individual color separation originals to form at least one relief part-image corresponding to a different projection color, each of said color separation originals being transparent in the areas of the particular projection colors of the individual color separation originals, each of said relief part-images of the projection color adjoining one another without overlap and having a depth different than said uniform relief depth and different from those relief part-images corresponding to other projection colors, which are transparent in the area of their corresponding projection color, part-image areas of which adjoining one another without overlap,) said image-wise exposing through each individual color separation original provided with a different energy density for each color separation original,
    (c) said energy density used for each image-wise exposing through an individual color separation original being lower than the required energy density for an exposure of a similar recording layer through the same color separation original without a preceding grating exposure, to obtain the required projection color, and
    (d) developing said exposed recording layer.

2. A process as recited in claim 1 wherein said image-wise exposing step comprises exposing each of said color separation originals for a time sufficient to provide, upon subsequent development, a relief depth due to said image-wise exposure of less than said uniform relief depth.

3. A process as recited in claim 1 further comprising the step of image-wise exposing said recording layer through n-1 color separation originals where n is an integer number corresponding to the total number of colors recorded in said recording layer.

4. A process as recited in claim 1 wherein the step of image-wise exposing said recording layer comprises image-wise exposing with color separation originals which are transparent for the particular projection color and for the white light projection.

5. A process as recited in claim 1 wherein comprises an exposure through a separation original being transparent for the projection color black.

6. A process according to claim 1 wherein the photoresist layer is positive-acting.

* * * * *

UNITED STATES PATENT OFFICE
CERTIFICATE OF CORRECTION

Patent No. 4,269,932          Dated May 26, 1981

Inventor(s) Roland MORAW and Renate SCHADLICH

It is certified that error appears in the above-identified patent and that said Letters Patent are hereby corrected as shown below:

IN THE CLAIMS:

Column 6, Claim 1, Line 34, kindly delete "path" and insert instead -- depth --.

Column 6, Claim 1, Line 49, kindly delete ", which" and insert instead -- , (and which --.

Column 8, Claim 5, Line 4, kindly delete "wherein" and insert instead -- which --.

Signed and Sealed this

Ninth Day of February 1982

[SEAL]

Attest:

GERALD J. MOSSINGHOFF

Attesting Officer      Commissioner of Patents and Trademarks